United States Patent [19]
Chiang et al.

[11] Patent Number: 6,025,751
[45] Date of Patent: Feb. 15, 2000

[54] SELF-BOOTSTRAPPING WORD-LINE DRIVER CIRCUIT AND METHOD

[75] Inventors: Paul M-Bhor Chiang, Cupertino; Chia-Jen Chang, San Jose; Hung-Mao Lin, San Jose; Rita Au Hsu, San Jose, all of Calif.

[73] Assignee: Silicon Magic Corporation, Santa Clara, Calif.

[21] Appl. No.: 08/947,754

[22] Filed: Oct. 8, 1997

[51] Int. Cl.$^7$ .................................................. H03M 7/162
[52] U.S. Cl. .............................................................. 327/589
[58] Field of Search .................................. 327/390, 530, 327/534–538, 540–546, 589; 326/80–83, 85–88

[56] References Cited

U.S. PATENT DOCUMENTS

| | | | |
|---|---|---|---|
| 5,514,994 | 5/1996 | Sawada | 327/390 |
| 5,670,909 | 9/1997 | Kawasaki | 327/543 |
| 5,767,729 | 6/1998 | Song | 327/390 |

*Primary Examiner*—My-Trang Nuton
*Attorney, Agent, or Firm*—Sawyer & Associates

[57] ABSTRACT

Aspects for self bootstrapping word-line driver circuitry are provided. In a circuit aspect, a word-line driver circuit for a memory cell in a semiconductor memory includes a signal input means, the signal input means comprising a first plurality of transistors, the first plurality of transistors receiving an input voltage signal higher than a voltage supply signal of the semiconductor memory. The circuit further includes a signal output means, the signal output means comprising a second plurality of transistors coupled to the first plurality of transistors and providing an output drive signal sufficient for the memory cell.

In a method aspect, a method for providing proper voltage level output of a word-line driver circuit for a semiconductor memory includes forming a self-bootstrap circuit as the word-line driver circuit and providing an input voltage signal to the self-bootstrap circuit, the input voltage signal acting as a source voltage for the circuit and being higher by a predetermined value than a supply voltage of the semiconductor memory.

21 Claims, 3 Drawing Sheets

SELF-BOOTSTRAPPING WORD-LINE DRIVER CIRCUIT AND METHOD

FIELD OF THE INVENTION

The present invention relates to drive circuitry for memory cells, and more particularly to word-line driver self-bootstrap circuitry.

BACKGROUND OF THE INVENTION

Many integrated circuits currently benefit from the advantages of complimentary metal-oxide-semiconductor (CMOS) technology. CMOS circuits employ both p-type MOS (PMOS) transistors and n-type MOS (NMOS) transistors to achieve the desired circuit operation. However, utilization of PMOS transistors suffers from certain disadvantages, including increased area requirements due to the required minimum spacing between PMOS and NMOS transistors, as dictated by the semiconductor process employed. Further, reduced current driveability is due to the lower mobility of holes as compared with electrons. Some circuits, e.g., dynamic random access memory (DRAM) circuits, suffer more significantly from these disadvantages, since they require high bit density and high speed performance.

In order to avoid the problem of increased area consumption, DRAMs are often designed using only NMOS circuitry for certain portions. These portions typically include pitch-constrained portions, such as the memory cell circuitry of the DRAM, the bit-line sense amplifier circuitry, row and column decoder circuitry, and word-line driver circuitry. However, NMOS circuitry tends to suffer from an inability to output a logic "HIGH" level equal to the voltage supply level, VDD, of the circuitry. Typically, application of the voltage supply level VDD to the drain and gate terminals of an NMOS transistor produces a maximum voltage at the source terminal equal to VDD less the threshold voltage (Vt) of the transistor (e.g., VDD-Vt), as is well known to those skilled in the art.

In order to better achieve proper "HIGH" logic level output from NMOS circuitry, especially for word-line driver circuitry, some systems employ depletion-mode NMOS transistors, which have a threshold voltage less than zero volts, to avoid the reduced maximum voltage. Unfortunately, extra processing steps are typically required to produce depletion-mode NMOS transistors. Further, a negative gate voltage is needed turn the depletion-mode NMOS transistor off.

Other systems employ bootstrap circuitry to better drive the word lines in a DRAM. While differing implementations of bootstrap circuits are well known, typically only self-bootstrap circuits are suitable for use in pitch-constrained circuits, such as word-line driver circuits. An example of a typical prior art self-bootstrap circuit is presented with reference to FIG. 1. A SELECT signal from a row decoder circuit (not shown) is input at a node 10. The signal is inverted via the transistors 12 and 14, e.g., a HIGH level SELECT signal at node 10 results in a LOW level signal at node 16. The signal at node 16 is then suitably inverted via the transistors 18 and 20, e.g., the LOW level signal at node 16 results in a HIGH level signal at node 22. The transistors 12 and 18 suitably comprise PMOS transistors coupled at a source to VDD and a drain to a drain of transistor 14 or 20, respectively, where transistors 14 and 20 suitably comprise NMOS transistors, with each of their sources coupled to ground.

With a LOW level signal at node 16, transistor 24, e.g. an NMOS transistor coupled at a source to ground, at a drain to a Wordline output coupled to a row of memory cells (not shown), and at a gate to node 16, is suitably turned off. A transistor 26, e.g., an NMOS transistor coupled at a gate to VDD, at a drain to node 22 and at a source to a node 28, is turned on. The voltage at node 28, VG, goes to a level of VDD-Vt$_{26}$ (VDD less the threshold voltage of transistor 26). Once the voltage VG is settled, the voltage input as a boost voltage, Vboost, to a drain of an NMOS transistor 30, is increased from a ground potential to a higher value, e.g., VDD+1.5 volts (V). Capacitive coupling suitably raises VG high enough for the signal Vboost to pass through transistor 30 without a voltage drop.

Conversely, with a LOW level SELECT signal, a HIGH level signal is present at node 16. This turns transistor 24 on, which results in the Wordline output being pulled to the ground voltage potential.

While the self-bootstrap circuit of FIG. 1 may successfully drive the Wordline output for some circuit designs, problems arise when the threshold voltages of transistors 26, 30, or in the memory cell coupled to receive the Wordline output, are too high, which lowers the voltage level of the HIGH level signal being transmitted and causes an insufficient word-line voltage. Further, as reduced power consumption in circuitry becomes more desirable, the supply voltage VDD decreases. Unfortunately, a proportional decrease in the threshold voltage of the self-bootstrap circuit's transistors is usually not achieved. Again, this results in the output of the word-line driver circuitry providing an insufficient word-line driver voltage.

Accordingly, what is needed is a self-bootstrap circuit that provides sufficient voltage levels for circuitry powered by reduced power supply voltages.

SUMMARY OF THE INVENTION

Aspects for word-line driver circuitry are provided. In a circuit aspect, a word-line driver circuit for a memory cell in a semiconductor memory includes a signal input means, the signal input means comprising a first plurality of transistors, the first plurality of transistors receiving an input voltage signal higher than a voltage supply signal of the semiconductor memory. The circuit further includes a signal output means, the signal output means comprising a second plurality of transistors coupled to the first plurality of transistors and providing an output drive signal sufficient for the memory cell.

In a method aspect, a method for providing proper voltage level output of a word-line driver circuit for a semiconductor memory includes forming a self-bootstrap circuit as the word-line driver circuit and providing an input voltage signal to the self-bootstrap circuit, the input voltage signal acting as a source voltage for the circuit and being higher by a predetermined value than a supply voltage of the semiconductor memory.

With the present invention, drive voltages for memory cells are better maintained for circuits with reduced supply voltages. Thus, reduced power consumption concerns may be appropriately addressed without affecting proper word-line driver circuit operations. Also, the present invention provides a sufficient word line voltage even if the threshold voltage for NMOS transistors is high in a given process technology. Further, the present invention effectively achieves the preferred drive voltages through a modification to a typical self-bootstrap circuit. Thus, an elegant and efficient solution is provided. These and other advantages of the aspects of the present invention will be more fully understood in conjunction with the following detailed description and accompanying drawings.

DETAILED DESCRIPTION

The present invention relates to word-line driver circuitry for DRAMs. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
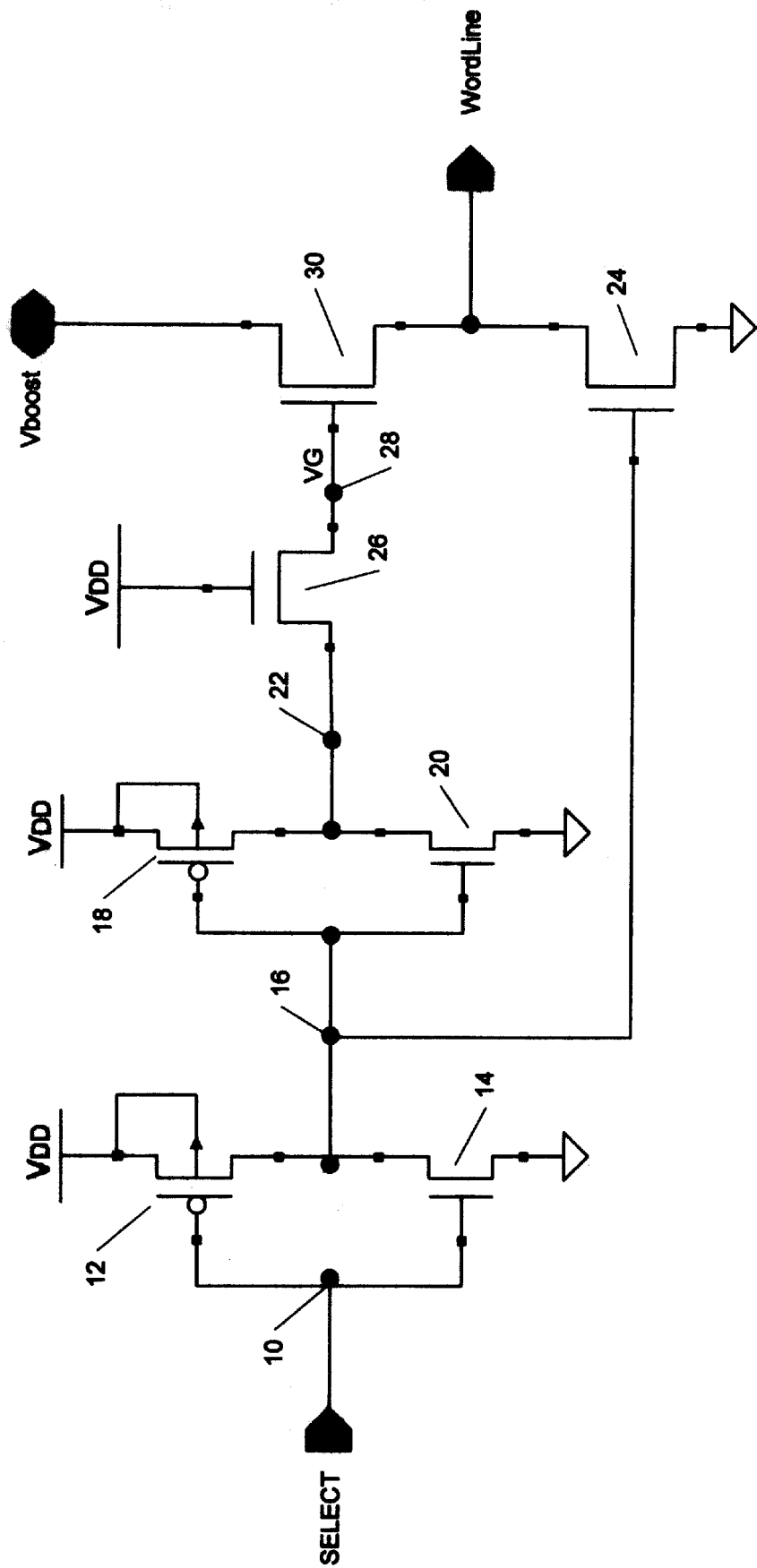
FIG. 1 illustrates a prior art self-bootstrap circuit.
Figure 2:
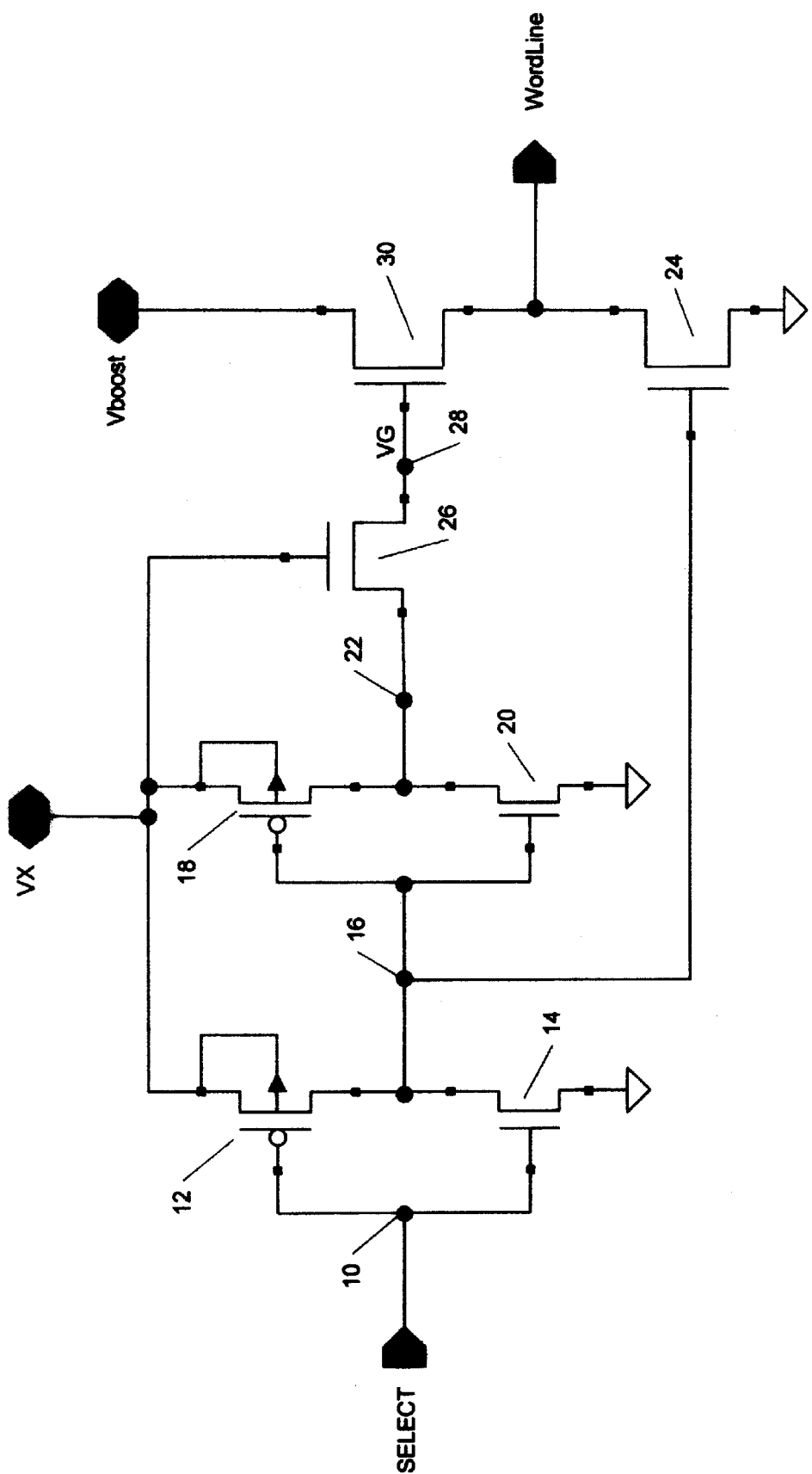
FIG. 2 illustrates a self-bootstrap circuit in accordance with the present invention.

In accordance with the present invention, a self-bootstrap circuit capable of producing sufficient word-line driver voltages is achieved. FIG. 2 illustrates a preferred embodiment of the self-bootstrap circuit. Components described with reference to the self-bootstrap circuit of FIG. 1 are labelled similarly in FIG. 2. In contrast to the prior art self-bootstrap circuit, the present invention couples transistors 12, 18, and 26 to a voltage source Vx, rather than the voltage supply voltage VDD. Preferably, Vx is a constant voltage provided at a level of at least 1.0 V higher than that of VDD. Further, Vx suitably is generated by a peripheral circuit to the self-bootstrap circuit and lies outside of a pitch-constrained area, i.e., row decoder area, of the DRAM. Any desired and suitable voltage circuit for producing Vx may be utilized, including another form of a bootstrap circuit, as is well understood by those skilled in the art.

It should be noted that with the use of a Vx voltage greater than VDD, the select signal from a row decoder circuit must have the same increased voltage as Vx when at a logic "high." This may be achieved by using a level-shifter circuit, as well-known by those skilled in the art.

Figure 3A:
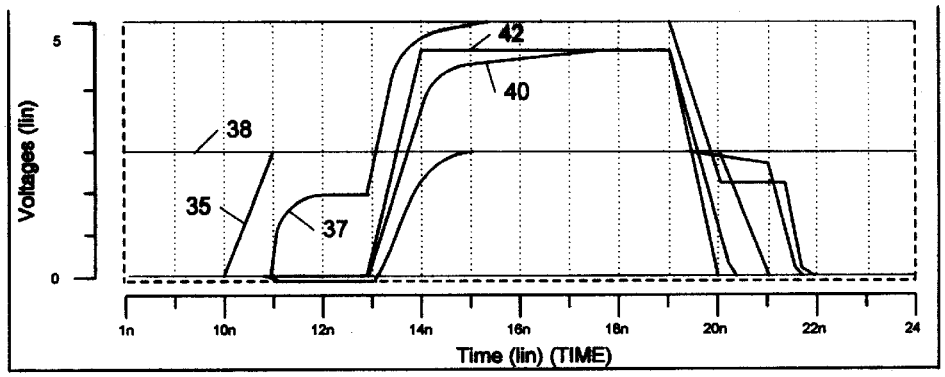
FIGS. 3a and 3b illustrate voltage versus time graphs associated with the circuit of FIG. 1.
Figure 3B:
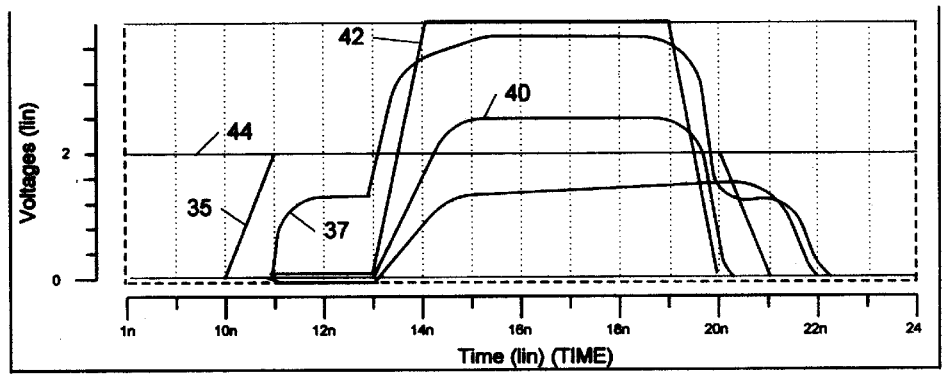

With the use of the Vx voltage in place of the supply voltage VDD, the voltage level of the Wordline output provides a sufficient voltage level for a HIGH signal in a memory cell (not shown) that is coupled to the Wordline output FIGS. 3a, 3b, 4a, and 4b more fully illustrate the improvement achieved in Wordline output with the use of the Vx voltage in accordance with the present invention. FIGS. 3a and 3b suitably illustrate voltage versus time graphs of the various signals associated with the self-bootstrap circuit of FIG. 1, including SELECT 35, and VG 37. As shown in FIG. 3a, when a 3 V VDD signal 38 is utilized in the self-bootstrap circuit of FIG. 1, the Wordline output signal 40 follows the level of Vboost signal 42 at a HIGH level of approximately 4.5 V. However, as shown in FIG. 3b, when a 2 V VDD signal 44 is utilized, the voltage level of the Wordline signal 40 is significantly lower than Vboost. Thus, the Wordline output is significantly lower than desired when transmitting a HIGH signal and driving a memory cell for a reduced input voltage supply.

Figure 4A:
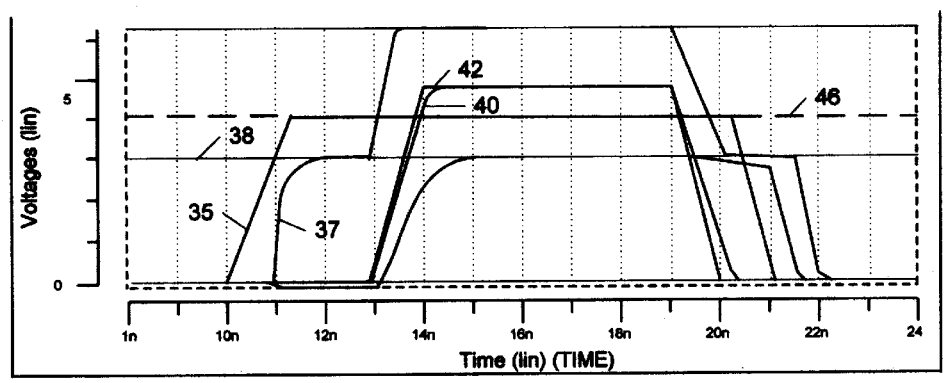
FIGS. 4a and 4b illustrate voltage versus time graphs associated with the circuit of FIG. 2.
Figure 4B:
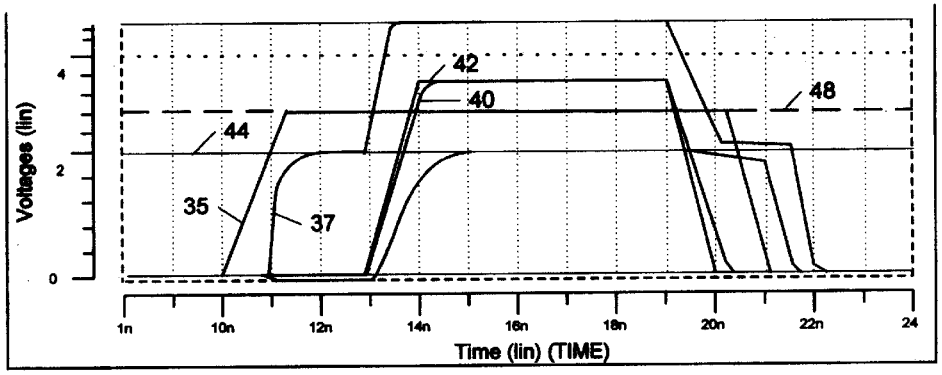

FIGS. 4a and 4b suitably illustrate voltage versus time graphs for the signals associated with the improved self-bootstrap circuit of FIG. 2. When the VDD signal 38 of approximately 3 V is utilized, a Vx signal 46 is suitably about 4 V, and the Wordline output 40 follows the Vboost signal 42 at a HIGH level of approximately 4.5 V. As shown in FIG. 4b, when the VDD signal 44 of about 2 V is utilized, a Vx signal 48 of about 3 V is input to the self-bootstrap circuit. Under these circumstances, the voltage level of the Wordline 40 suitably remains at approximately the same level of the Vboost signal 42, i.e., at about 3.5 V. Thus, the HIGH level output of the circuit remains at a sufficient level for driving a memory cell.

With the present invention, a straightforward and efficient manner of achieving proper voltage level output for driving a word line in a memory circuit is provided. Further, reductions in circuit supply voltages are readily compensated without detriment to self-bootstrap circuit operations. The use of the present invention is also beneficial in cases where the NMOS threshold voltage is too high for use in the typical prior art bootstrap circuit. Additionally, the integrity of utilizing self-bootstrap circuitry in pitch-constrained portions of a DRAM is conveniently maintained.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A word-line driver circuit for a memory cell in a semiconductor memory, the word-line driver circuit comprising:

a signal input means, the signal input means comprising a first plurality of transistors, the first plurality of transistors receiving an increased voltage supply signal higher than a main voltage supply signal of the semiconductor memory and a decoded address signal, wherein the logic HIGH state of the decoded address input signal reaches a voltage equal to the increased voltage supply signal; and a signal output means, the signal output means comprising a second plurality of transistors coupled to the first plurality of transistors, the signal output means providing an output drive signal sufficient for the memory cell.

2. The circuit of claim 1 wherein the semiconductor memory comprises a dynamic random access memory (DRAM).

3. The circuit of claim 1 wherein the first plurality of transistors further comprises at least one PMOS transistor and at least one NMOS transistor.

4. The circuit of claim 3 wherein the increased voltage supply signal is received at a source of the at least one PMOS transistor and at a gate of the at least one NMOS transistor.

5. The circuit of claim 1 wherein the second plurality of transistors comprises first and second NMOS transistors.

6. The circuit of claim 5 wherein the first NMOS transistor is coupled at a gate to a source of the at least one NMOS transistor.

7. The circuit of claim 6 wherein the output drive signal is output from a source of the first NMOS transistor.

8. The circuit of claim 1 wherein the increased voltage supply signal is about 1 volt (V) higher than the main voltage supply signal of the semiconductor memory.

9. A method for providing proper voltage level output of a word-line driver circuit for a semiconductor memory, the method comprising:

forming a self-bootstrap circuit as the word-line driver circuit, the self-bootstrap circuit receiving a decoded address signal; and providing an increased voltage supply signal to the self-bootstrap circuit, the increased voltage supply signal acting as a source voltage for the circuit and being higher by a predetermined value than a main supply voltage of the semiconductor memory, and further wherein the decoded address signal in a logic HIGH state has a voltage level equal to the increased voltage supply signal.

10. The method of claim 9 wherein the semiconductor memory comprises a dynamic random access memory (DRAM).

11. The method of claim 9 wherein the increased voltage supply signal is about one volt higher than the supply voltage.

12. The method of claim 9 wherein the self-bootstrap circuit is formed in a pitch-constrained area of the semiconductor memory.

13. The method of claim 9 wherein the increased voltage supply signal is provided from a peripheral circuit.

14. The method of claim 13 wherein the peripheral circuit comprises a bootstrap circuit.

15. The method of claim 14 wherein the peripheral circuit is formed outside of the pitch-constrained area of the semiconductor memory.

16. A method of self-bootstrapping for pitch constrained circuits comprising:

inputting a selection signal to a bootstrap circuit;

providing a voltage supply signal to the bootstrap circuit, the voltage supply signal being a predetermined amount above a circuit supply voltage; and outputting a drive signal from the bootstrap circuit, wherein the voltage supply signal ensures a sufficiently high voltage level in the drive signal when the selection signal is input at a high logic level, the high logic level having a voltage level matching the voltage supply signal.

17. The method of claim 16 wherein the predetermined amount comprises about 1 V.

18. The method of claim 16 wherein the sufficiently high voltage level comprises about 3.5 V.

19. The method of claim 16 further comprising providing a voltage boost signal to the bootstrap circuit.

20. The method of claim 19 wherein the drive signal substantially follows the voltage boost signal.

21. The method of claim 19 wherein the HIGH state of voltage boost signal is greater than the main circuit supply voltage.

* * * * *